United States Patent
Epperson (10) Patent No.: US 6,701,134 B1
(45) Date of Patent: Mar. 2, 2004

(54) INCREASED DYNAMIC RANGE FOR POWER AMPLIFIERS USED WITH POLAR MODULATION

(75) Inventor: Darrell Epperson, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/287,984

(22) Filed: Nov. 5, 2002

(51) Int. Cl.[7] .................................... H04B 1/04
(52) U.S. Cl. ................. 455/102; 455/108; 455/127.3; 375/300; 330/10
(58) Field of Search ............................. 455/102, 108, 455/91, 126, 62, 127.3, 127.2, 110, 93; 375/300, 302, 308, 296; 332/145, 151, 160, 149, 159, 161, 162; 330/10, 136, 207, 297, 251, 107

(56) References Cited

U.S. PATENT DOCUMENTS

| | | | |
|---|---|---|---|
| 4,446,440 A | 5/1984 | Bell | 330/10 |
| 4,701,957 A | 10/1987 | Smith | 381/61 |
| 4,739,759 A | 4/1988 | Rexroth et al. | 128/303.14 |
| 5,204,637 A | 4/1993 | Trinh | 330/129 |
| 5,251,330 A | 10/1993 | Chiba et al. | 455/91 |
| 5,276,917 A | 1/1994 | Vanhanen et al. | 455/89 |
| 5,438,683 A | 8/1995 | Durtler et al. | 455/74 |
| 5,442,322 A | 8/1995 | Kornfeld et al. | 330/285 |
| 5,493,255 A | 2/1996 | Murtojarvi | 330/296 |
| 5,511,234 A | 4/1996 | Ha | 455/127 |
| 5,530,404 A | 6/1996 | Debroux | 330/278 |
| 5,530,923 A | 6/1996 | Heinonen et al. | 455/126 |
| 5,553,318 A | 9/1996 | Ohmagari et al. | 455/126 |
| 5,559,471 A | 9/1996 | Black | 330/277 |
| 5,561,395 A | 10/1996 | Melton et al. | 330/2 |
| 5,574,991 A | 11/1996 | Miyama et al. | 455/126 |
| 5,606,284 A | 2/1997 | Tamesue et al. | 330/129 |
| 5,621,354 A | 4/1997 | Mitzlaff | 330/52 |
| 5,715,527 A | 2/1998 | Horii et al. | 455/126 |
| 5,828,692 A | * 10/1998 | Walley | 375/130 |
| 5,831,477 A | 11/1998 | Tsumura | 330/51 |
| 5,834,975 A | 11/1998 | Bartlett et al. | 330/278 |
| 5,847,602 A | * 12/1998 | Su | 330/10 |
| 5,861,776 A | 1/1999 | Swanson | 330/124 R |
| 5,862,461 A | 1/1999 | Yoshizawa et al. | 455/127 |
| 5,872,481 A | 2/1999 | Sevic et al. | 330/51 |
| 5,942,946 A | 8/1999 | Su et al. | 330/310 |

(List continued on next page.)

FOREIGN PATENT DOCUMENTS

| | | | | |
|---|---|---|---|---|
| JP | 61095603 | 5/1986 | | H03G/3/10 |
| JP | 5235657 | 9/1993 | | H03F/3/22 |

*Primary Examiner*—P Tran
(74) *Attorney, Agent, or Firm*—Withrow & Terranova, PLLC (57) ABSTRACT

The present invention provides power amplification circuitry having multiple amplifier stages in series and adapted to facilitate polar modulation. As such, the amplifier circuitry receives a frequency signal representing the frequency and phase components of the signal to be transmitted, as well as an amplitude signal presenting the amplitude component of the signal to be transmitted. The frequency component is amplified by the amplification circuitry. The amplitude component controls the supply voltage provided to the amplifier stages in the amplification circuitry. To increase the dynamic range of the amplification circuitry, the final stage or stages of the amplification circuitry are selectively disabled when lower output powers are necessary, and enabled when higher output powers are required. When disabled, the output stage is biased in a manner such that it effectively functions as a series capacitor, coupling the amplified signal from the prior amplifier stages through the final output stage to an antenna for transmission.

14 Claims, 4 Drawing Sheets

U.S. PATENT DOCUMENTS

| | | | |
|---|---|---|---|
| 5,973,556 A * | 10/1999 | Su | 330/10 |
| 5,994,963 A | 11/1999 | Kawai et al. | 330/277 |
| 6,002,923 A * | 12/1999 | Sahlman | 455/118 |
| 6,025,753 A | 2/2000 | Landherr et al. | 330/285 |
| 6,043,707 A * | 3/2000 | Budnik | 330/10 |
| 6,049,704 A | 4/2000 | Peckham et al. | 455/232.1 |
| 6,069,530 A | 5/2000 | Clark | 330/149 |
| 6,101,224 A * | 8/2000 | Lindoff et al. | 375/300 |
| 6,148,220 A | 11/2000 | Sharp et al. | 455/572 |
| 6,160,855 A * | 12/2000 | Nakamura et al. | 375/280 |
| 6,188,877 B1 | 2/2001 | Boesch et al. | 455/74 |
| RE37,407 E * | 10/2001 | Eisenberg et al. | 330/2 |
| 6,327,462 B1 | 12/2001 | Loke et al. | 455/127 |
| 6,356,745 B1 | 3/2002 | Lee et al. | 455/232.1 |
| 6,369,649 B2 | 4/2002 | Nakajima | 330/51 |
| 6,374,127 B1 | 4/2002 | Park | 455/572 |
| 6,377,784 B2 * | 4/2002 | McCune | 455/108 |
| 6,866,177 * | 4/2002 | McCune et al. | 332/103 |
| 6,397,090 B1 | 5/2002 | Cho | 455/574 |
| 6,405,054 B1 | 6/2002 | Rozenblit et al. | 455/522 |
| 6,441,694 B1 * | 8/2002 | Turcotte et al. | 332/100 |
| 6,445,249 B1 * | 9/2002 | Khan et al. | 330/149 |
| 2001/0006355 A1 | 7/2001 | Park | 330/285 |
| 2002/0002038 A1 | 1/2002 | Seawright et al. | 455/127 |
| 2002/0077066 A1 | 6/2002 | Pehlke et al. | 455/73 |
| 2002/0127980 A1 | 9/2002 | Amanullah et al. | 455/127 |
| 2003/0083026 A1 | 5/2003 | Liu | 455/127 |
| 2003/0090325 A1 | 5/2003 | Canyon et al. | 330/285 |

* cited by examiner

INCREASED DYNAMIC RANGE FOR POWER AMPLIFIERS USED WITH POLAR MODULATION

FIELD OF THE INVENTION

The present invention relates to an improvement for an amplifier, and particularly to an amplifier circuit that provides increased dynamic range in polar modulation applications.

BACKGROUND OF THE INVENTION

Competitive forces in the wireless communication industry are continuously forcing prices down and requiring higher data rates, especially for non-voice applications. To achieve lower costs, wireless communication device designers must reduce parts count as well as take advantage of economical components. Higher data rate requirements force higher performance from wireless communication devices. In addition to these pressures, wireless communication devices must operate very efficiently to reduce power consumption in an effort to maximize battery life.

Most of the power consumption in a wireless communication device takes place in the power amplifier circuitry. In an effort to maximize efficiency, power amplifiers must operate near peak efficiency over varying power ranges, which are required in most wireless communication architectures. In addition to controlling output power, certain communication architectures incorporate polar modulation, wherein part of the modulation scheme requires modulation of the supply voltages provided to the power amplifiers. Unfortunately, the dynamic range required for advanced wireless communication architectures, such as the Enhanced Data Rates for GSM Evolution (EDGE), requires the power amplifiers to provide output power over a significant dynamic range, such as 45 dB. These large dynamic range requirements have forced additional complexity and parts counts into these wireless communication devices. Further, the additional parts and complexity have led to less efficient operation.

Accordingly, there is a need for power amplifier circuitry in polar modulation applications that provides efficient operation in a cost-effective and easy to implement manner.

SUMMARY OF THE INVENTION

The present invention provides power amplification circuitry having multiple amplifier stages in series and adapted to facilitate polar modulation. As such, the amplifier circuitry receives a frequency signal representing the frequency and phase components of the signal to be transmitted, as well as an amplitude signal presenting the amplitude component of the signal to be transmitted. The frequency component is amplified by the amplification circuitry. The amplitude component controls the supply voltage provided to the amplifier stages in the amplification circuitry. To increase the dynamic range of the amplification circuitry, the final stage or stages of the amplification circuitry are selectively disabled when lower output powers are necessary, and enabled when higher output powers are required. When disabled, the output stage is biased in a manner such that it effectively functions as a series capacitor, coupling the amplified signal from the prior amplifier stages through the final output stage to an antenna for transmission.

Preferably, the transistors forming the output stage or stages are disabled by allowing the collectors or drains, as the case may be, to float, while the base or gate remains biased. Application of a constant bias to the base or gate of the output stage transistors provides a constant load for the previous stages and allows the devices to effectively operate as a capacitor. As such, when the output stage is disabled, the prior amplifier stages can operate at more efficient levels while providing lower output powers.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
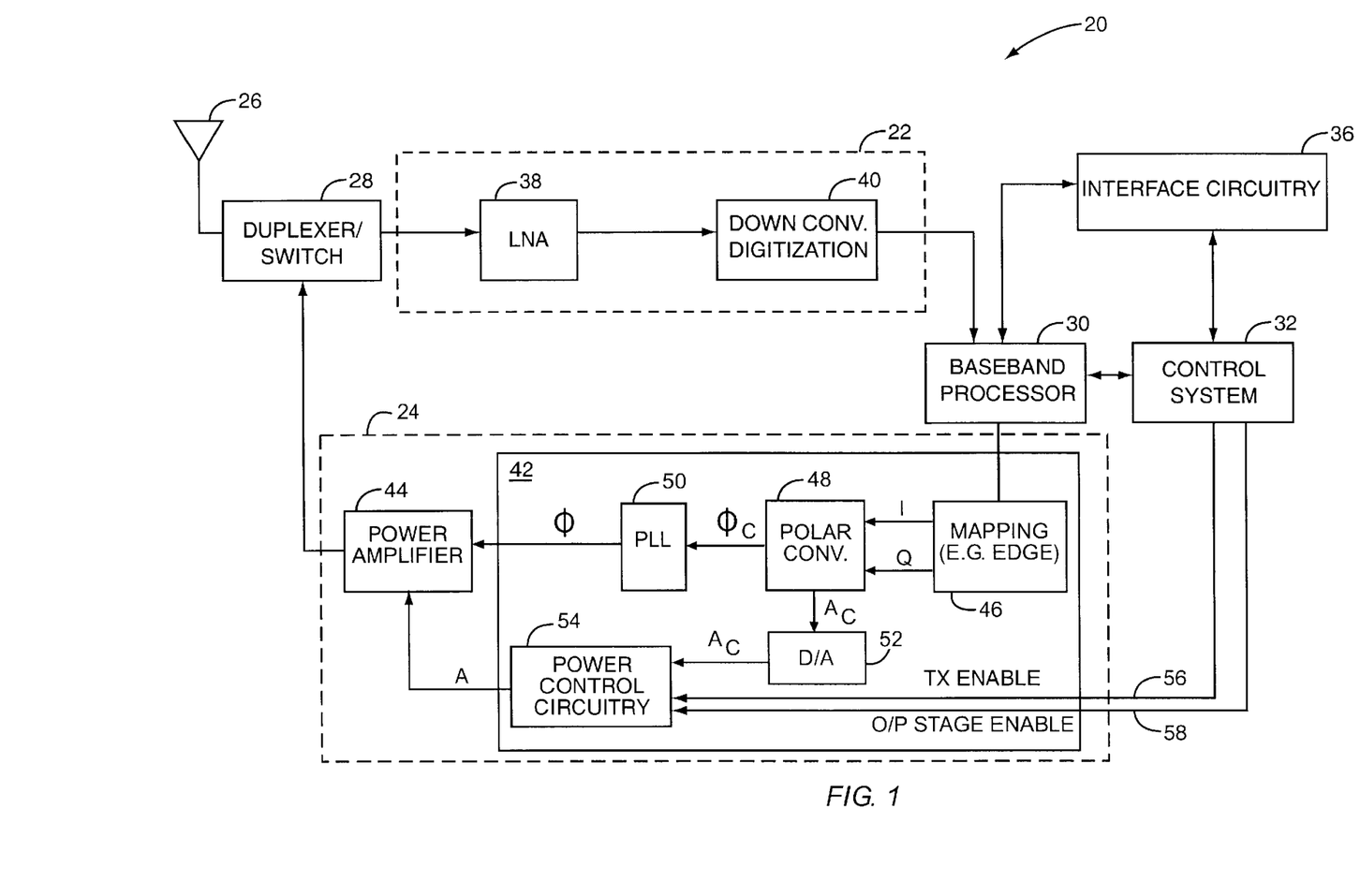
FIG. 1 is a schematic drawing of a user element constructed according to the present invention.

The present invention is preferably incorporated in a user element 20, such as a mobile telephone, personal digital assistant, wireless modem, wireless network interface, or the like, which implements polar modulation and requires substantially linear operation over a significant amount of dynamic range. The basic architecture of the user element 20 is represented in FIG. 1 and may include a receiver front end 22, a radio frequency transmitter section 24, an antenna 26, a duplexer or switch 28, a baseband processor 30, a control system 32, and interface circuitry 36. The receiver front end 22 receives information bearing radio frequency signals from one or more remote transmitters provided by a base station (not shown). A low noise amplifier 38 amplifies the signal. A filter circuit (not shown) minimizes broadband interference in the received signal, while a downconverter 40 downconverts the filtered, received signal to an intermediate or baseband frequency signal, which is then digitized into one or more digital streams.

The baseband processor 30 processes the digitized received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data from the interface circuitry 36 directly or indirectly via the control system 32 to encode for transmission. The encoded data is output to the transmitter section 24, where it is modulated for transmission using polar modulation techniques. For polar modulation, a polar modulator 42 will process the encoded data and generate an amplitude signal (A) and a phase (or frequency) signal ($\phi$) to drive the power amplifier 44. The amplitude signal (A) controls the power supply voltage of the power amplifier 44, while the phase signal ($\phi$) represents the frequency and phase content of the modulated signal.

In one embodiment of the present invention, the polar modulator 42 may comprise several components, including, but not limited too, a mapping module 46, a polar converter 48, a phase-locked loop (PLL) 50, a digital-to-analog (D/A) converter 52, and power control circuitry 54. Although shown separately, the power amplifier 44 and the power control circuitry 54 may reside in the same module. In this embodiment, the modulation scheme for the polar modulator 42 is an Enhanced Data Rates for GSM Evolution (EDGE) modulation scheme and thus, the bit rate is 812.5 kbps. This data is passed to the mapping module 46, where every three consecutive data bits are mapped into a corresponding symbol. The resulting symbols are Grey coded and rotated by $3\pi/8$ on each symbol as per European Telecommunications Standards Institute (ETSI) specifications. For EDGE modulation, the output of the mapping module 46 provides a corresponding one of 16 rectangular coordinates, generally referred to an in-phase (I) and quadrature (Q) coordinates, for each symbol. The in-phase and quadrature coordinates (I, Q) corresponding to each symbol are filtered using finite impulse response (FIR) filters (not shown) as dictated by the ETSI specifications and then converted from rectangular to polar coordinates by the polar converter 48.

The in-phase and quadrature coordinates (I, Q) are preferably converted into phase ($\phi_C$) and amplitude ($A_C$) control signals by the polar converter 48 using a classical CORDIC (coordinate rotation digital computer). Processing by the polar converter 48 also includes a conversion from a true phase signal to a frequency signal. This conversion is well understood in the art and for the purposes of the present invention, this conversion is treated as part of the CORDIC conversion. Further information about CORDIC algorithms may be found in *Proceedings of the 1998 ACM/SIGDA Sixth International Symposium On Field Programmable Gate Arrays* by Ray Andraka, Feb. 22–24, pp. 191–200 and "The CORDIC Trigonometric Computing Technique" by Jack E. Volder, *IRE Trans on Elect. Computers*, p.330, 1959, both of which are hereby incorporated by reference in their entireties.

At this point, the phase control signal ($\phi_C$), referred to as a frequency control signal ($\phi_C$), and amplitude control signal ($A_C$) separate and proceed by different paths, a frequency signal processing path and an amplitude signal processing path, respectively, to the power amplifier 44. With respect to the amplitude signal processing path, the digital amplitude control signal ($A_C$) is converted to an analog signal by the D/A converter 52. The output of the D/A converter 52 is an analog version of the amplitude control signal ($A_C$) and is used by the power control circuitry 54 to set the supply voltage on the power amplifier 44. Notably, the amplitude control signal ($A_C$) has a DC component reflecting the desired output power and an AC component reflecting the desired amplitude modulation characteristic. The power control circuitry 54 will process the amplitude control signal ($A_C$) and provide a proportionate amplitude signal (A) to drive the power amplifier 44. As the amplitude signal (A) changes, the voltage at the power amplifier 44 changes and the output power will vary as $V^2/2R_{out}$, where $R_{out}$ is effectively the load on the power amplifier 44. Accordingly, the amplitude signal (A) represents both a modulation and power level component at any given time. The power control circuitry 54 may also receive a transmit (TX) enable signal 56, which enables the power amplifier 44, and an output (O/P) stage enable signal 58, which selectively enables a final stage of the power amplifier 44 as will be described below in greater detail.

The frequency control signal ($\phi_C$) is used to set the frequency of the PLL 50, or like synthesizer, to generate the frequency signal ($\phi$) having the appropriate frequency and phase component to send to the power amplifier 44 for amplification. Accordingly, the power amplifier 44 will amplify the frequency signal ($\phi$) using the corresponding amplitude signal (A) to provide a modulated and amplified signal for transmission via the antenna 26. Further information pertaining to polar modulation may be found in commonly assigned U.S. patent application Ser. No. 10/139,560 filed May 6, 2002, 10/147,569 filed May 16, 2002, and 10/147,579 filed May 16, 2002, which are incorporated herein by reference.

Figure 2:
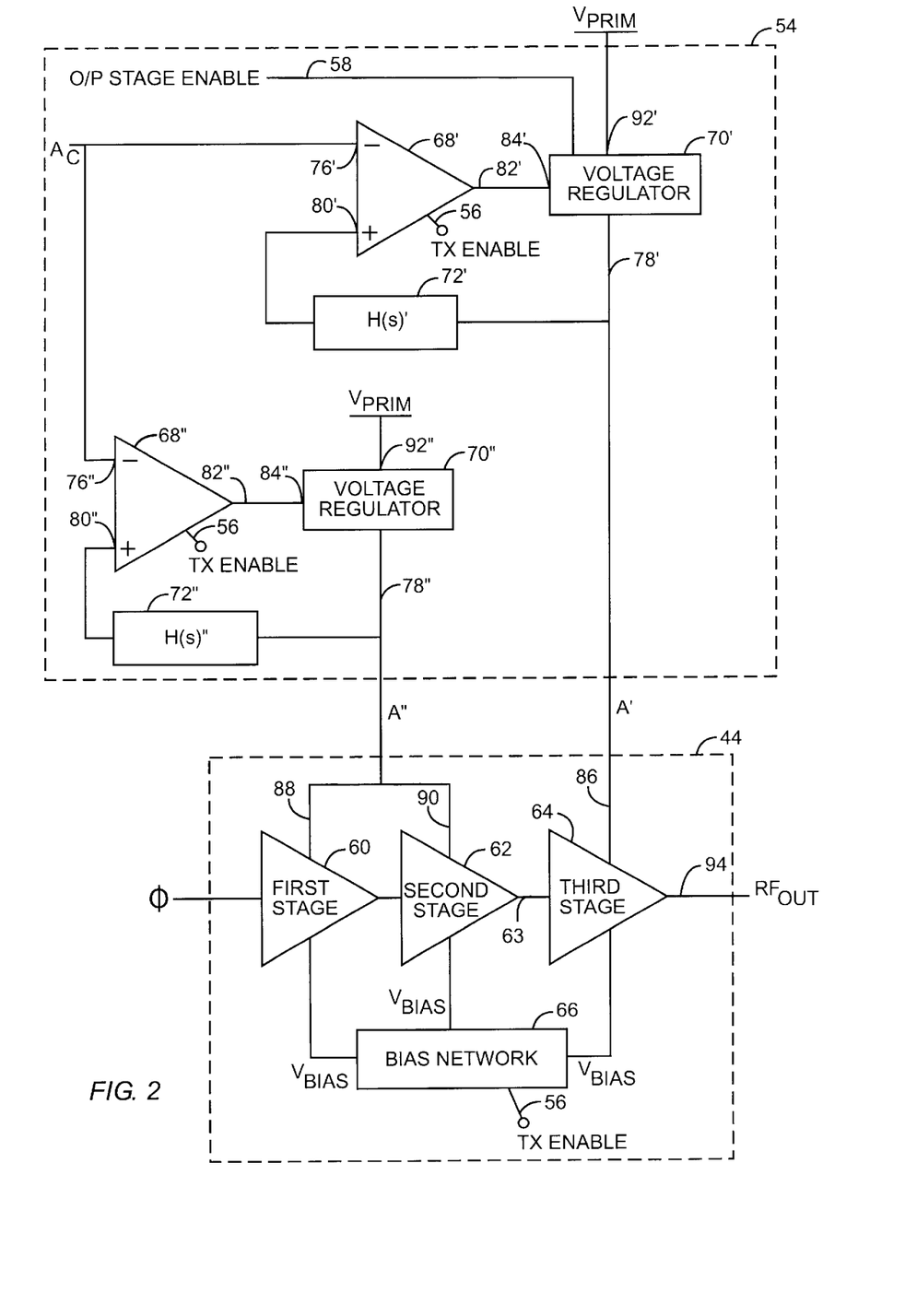
FIG. 2 is a schematic drawing of a power amplifier chain and control logic used in a user element according to one embodiment of the present invention.

While a detailed discussion of amplifier chains may be found in commonly owned U.S. patent application Ser. No. 09/878,461 filed Jun. 11, 2001 and 10/080,187 filed Feb. 21, 2002, the disclosures of which are hereby incorporated by reference, the following outlines the basic operation of a multistage amplifier. Turning now to FIG. 2, the power amplifier circuitry 44 is associated with power control circuitry 54. The power amplifier circuitry 44 may comprise any number of amplifier stages. In this embodiment, the power amplifier circuitry includes three amplifier stages, a first amplifier stage 60, a second amplifier stage 62, and a third amplifier stage 64, as well as a bias network 66 providing bias ($V_{BIAS}$) for each of the three amplifier stages 60, 62, and 64. The first and second amplifier stages 60, 62 are driver stages, while the third amplifier stage 64 is a final, output stage. In alternate embodiments, the bias network 66 may comprise multiple bias networks, one for each amplifier stage. Preferably, the bias provided to each stage 60, 62, and 64 is relatively stable regardless of power levels and the enablement of the third amplifier stage 64. Other bias arrangements are also possible, as those skilled in the art will recognize.

The power control circuitry 54 will preferably include two control sections. The first control section will control the final stage 64, while the second will preferably control the first and second stages 60, 62. The first section includes an error amplifier 68', a voltage regulator 70', and a feedback network 72' having a transfer function H(S)'. As noted, the power amplifier circuitry 44 provides gain for the frequency signal ($\phi$) to be transmitted under control of the power control circuitry 54 based on the amplitude control signal ($A_C$).

In the exemplary embodiment, the amplitude control signal ($A_C$) may be received by an inverting input 76' of an operational amplifier forming error amplifier 68'. The regulated output 78' of the voltage regulator 70' is fed back through a feedback network 72' and received by a non-inverting input 80' of error amplifier 68'. An output signal 82' from error amplifier 68' is provided to a control input 84' of voltage regulator 70' to control the regulated output 78' of voltage regulator 70'. The regulated output 78' represents the actual amplitude signal (A'), which drives the third output stage 64. Voltage regulator 70' regulates the voltage and the amplitude signal (A') supplied to the rail 86 of the third amplifier stage 64 to control the gain according to the amplitude control signal ($A_C$).

The second section of the power control circuitry 54 is similar to the first section and may include an error amplifier 68", a voltage regulator 70", and a feedback network 72" having a transfer function H(S)". The amplitude control signal ($A_C$) is also received by an inverting input 76" of an operational amplifier forming error amplifier 68". The regulated output 78" of voltage regulator 70" is fed back through feedback network 72" and received by a non-inverting input 80" of error amplifier 68". An output signal 82" from error amplifier 68" is provided to a control input 84" of voltage regulator 70" to control the regulated output 78" of voltage regulator 70". Voltage regulator 70" regulates the voltage supplied to the rails 88, 90 of the first amplifier stage 60 and the second amplifier stage 62, respectively, to control the gain according to the amplitude control signal ($A_C$). Accordingly, the rails 88, 90, 86 of the first, second, and third amplifier stages 60, 62, 64 may be controlled in unison as a function of the amplitude control signal ($A_C$) to amplify the frequency signal (φ). The rails 88, 90, 86 will typically be coupled to the collectors of bipolar transistors or drains of field effect transistors forming the respective amplifier stages 60, 62, 64, as will be appreciated by those skilled in the art.

Each of the voltage regulators 70' and 70" is connected directly to a fixed or primary supply voltage, $V_{PRIM}$, which will preferably be connected to the terminal for the positive potential of a battery. As noted, the bias network 66 supplies a fixed bias to the three power amplifier stages 60, 62, 64, regardless of the collector/drain voltage supplied to the first, second and third amplifier stages 60, 62, 64. The fixed bias incorporates traditional $V_{APC}$ signals, which are configured to maintain a constant bias, in the preferred embodiment.

The transmit enable signal, TX ENABLE 56, is a logic signal used to simultaneously enable or disable the error amplifiers 68' and 68" and the amplifier circuitry 44 by supplying or removing the bias to or from each of the three amplifier stages 60, 62, 64. A frequency signal (φ) to be amplified is provided at the input of the first amplifier stage 60 and amplified by either the first and second amplifier stages 60, 62 or all three amplifier stages 60, 62, 64 to provide an amplified output signal 94 ($RF_{OUT}$). The third amplifier stage 64 is selectively enabled or disabled by enabling or disabling the voltage regulator 70' with the output (O/P) stage enable signal 58. When enabled, the third amplifier stage 64 operates to amplify the frequency signal (φ), which has been amplified by the first and second amplifier stages 60, 62. When disabled, the third amplifier stage 64 is configured to effectively become a capacitance in series with the amplification path and output load.

While three amplifier stages are preferred, other arrangements of two, four, or more are contemplated. The teachings of the present invention apply to such arrangements, and one of ordinary skill in the art can modify the present teachings to such arrangements. Further, certain advantages may be realized by forming two or more of the amplifier stages 60, 62, 64 from a plurality of transistor cells arranged in parallel. In an exemplary embodiment, the first amplifier stage 60 comprises a single transistor cell; the second amplifier stage 62 comprises approximately six transistor cells; and the final amplifier stage 64 comprises forty-eight transistor cells.

For further information pertaining to the transistor arrays, reference is made to U.S. Pat. Nos. 5,608,353, HBT POWER AMPLIFIER, issued Mar. 4, 1997; and U.S. Pat. No. 5,629,648, HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entireties. Still further information may be found in commonly owned U.S. patent application Ser. No. 09/952,524, filed Sep. 14, 2001, the disclosure of which is hereby incorporated by reference. Exemplary bias networks 66 capable of being used in association with the present invention are described in further detail in U.S. patent application Ser. No. 09/467,415 filed Dec. 20,1999, currently pending, the disclosure of which is incorporated herein by reference in its entirety. Upon understanding the present invention, those skilled in the art will be able to construct any number of bias networks that are compatible with the present invention.

Figure 3:
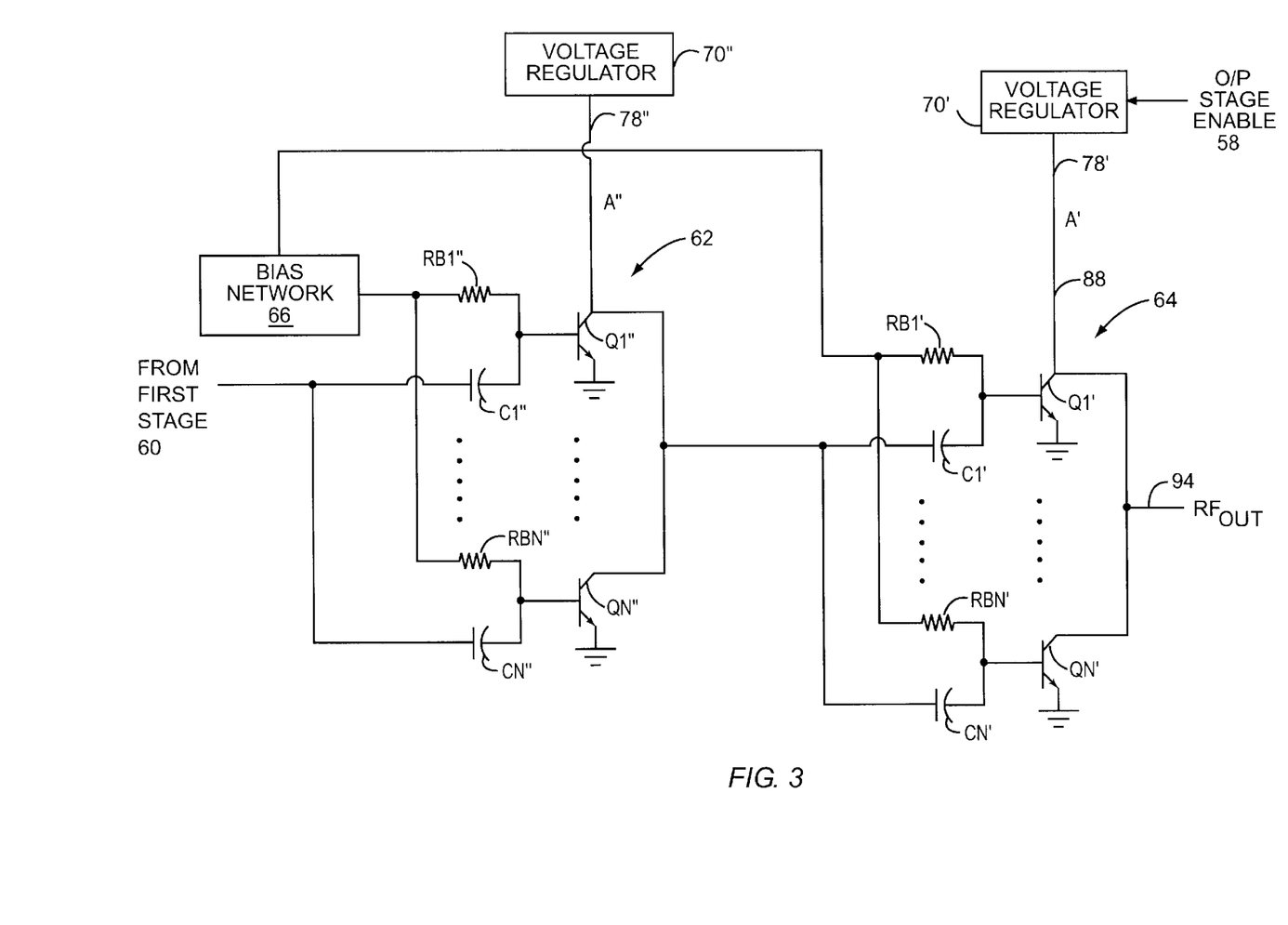
FIG. 3 is a more detailed schematic of the amplifier chain illustrated in FIG. 2.

With reference to FIG. 3, the first amplifier stage 60 is formed by a single transistor cell, and the second and third amplifier stages 62 and 64 are implemented using parallel transistor cells. A transistor cell is essentially a transistor, a resistor and a capacitor, such as Q1", RB1", and C1". The second amplifier stage 62 is comprised of a transistor network formed by transistors Q1" to QN". In this configuration, each transistor Q1" through QN" receives identical bias from the bias network 66 through resistors RB1" through RBN". Output from the first amplifier stage 60 comes into the second amplifier stage 62 and drives the transistor array through capacitors C1" through CN". Notably, the collectors of transistors Q1" through QN" of the second stage 62 are coupled together to provide a common output signal.

The output signal from the second amplifier stage 62 is directed to the third (final) amplifier stage 64. The third amplifier stage 64 is comprised of a transistor network formed by transistors Q1' to QN'. In this configuration, each transistor Q1' through QN' receives identical bias from the bias network 66 through the resistors RB1' through RBN'. The output signal from the second amplifier stage 62 is coupled to the third amplifier stage 64 and drives the transistor array through capacitors C1' through CN'. Notably, the collectors of transistors Q1' through QN' are coupled together to provide the output signal ($RF_{OUT}$) 94. When the third amplifier stage 64 is enabled by turning on the voltage regulator 70' with the output enable signal 58, transistors Q1' through QN' will conduct and provide amplification for the frequency signal (φ). When the third amplifier stage 64 is disabled by turning off the voltage regulator 70' with the output enable signal 58, transistors Q1' through QN' are disabled and do not conduct from the collectors to the respective emitters.

Figure 4:
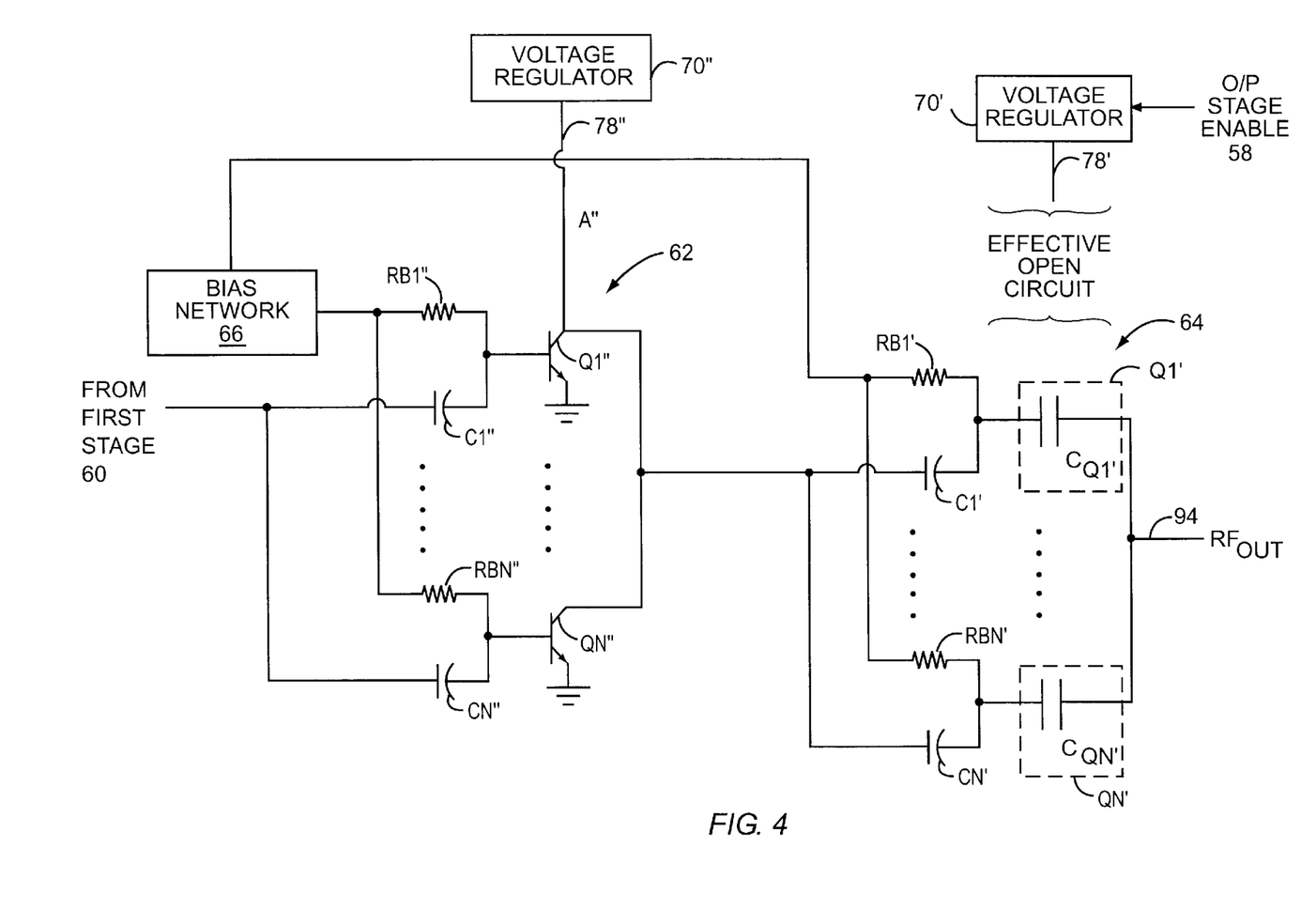
FIG. 4 is a more detailed schematic of the amplifier chain illustrated in FIG. 2 illustrating the effective circuit configuration when a third output stage is disabled.

When biased, the transistors Q1' through QN' will conduct the frequency signal (φ) provided by the second amplifier stage 62 between the collectors and bases of the respective transistors Q1' through QN', even when the voltage regulator output is disabled. As shown in FIG. 4, the collectors and bases for each of the disabled transistors Q1' through QN' are capacitively coupled by capacitances $C_{Q1}$, through $C_{QN}$, given the inherent characteristics of the transistors. Accordingly, when the transistors Q1' through QN' are disabled, the third amplifier stage 64 simply capacitively couples the output of the second amplifier stage 62 to the output of the third amplifier stage 64, wherein the output of the second amplifier stage 62 becomes the output signal $RF_{OUT}$ 94. The bias provided to the bases of transistors Q1' through QN' from the bias network 66 via resistors RB1' through RBN' is maintained even when the voltage regulator 70' is disabled, to set an appropriate impedance between the collectors and bases of the transistors Q1' through QN'. Accordingly, less overall gain is provided by the signal being transmitted, yet the first and second amplifier stages 60 and 62 can operate at a higher gain and thus at a more efficient level with lower distortion, even when lower levels of output power are needed.

The transistors Q1" through QN" and Q1' through QN' in the exemplary embodiment are biased to operate in saturation and are preferably heterojunction bipolar transistors (HBTs) formed on a single semiconductor and equally sized to form a transistor array. However, the inventive concepts defined herein are independent of technology (Si, GaAs, SiGe, etc.) as well as device type (BJT, FET, MESFET, HBT, etc.). Further, the number of transistors in each array need not be the same. Thus, N" does not necessarily equal N', although it may if needed or desired. As noted, in an exemplary embodiment, N"=6 and N'=48.

By selectively enabling the final amplifier stage or stages, the dynamic range for the over power amplifier 44 is significantly increased in an efficient manner and without excessive increases in parts count or die area. By allowing the collectors (or drains) of the final amplifier stage to float when disabled, a feed-through capacitor is created between the base (or gate) and collector (or drain). The driver amplifier stages, such as amplifier stages 60 and 62, are still varied in voltage and output power to provide the appropriate output power level and maintain linear operation throughout the power range. The use of constant base (or gate) bias for all amplifier stages, regardless of the enabling of the final amplifier stage, such as the third amplifier stage 64 maintains a constant load for the driver stages.

For an EDGE application requiring 45 dBm of linear power control, the present invention can be configured to enable the final stage when between 15 dBm and 35 dBm of output power is needed. The final stage can be disabled when output power is between 15 dBm and −20 dBm. Preferably, hysteresis is applied about the 15 dBm switching point.

Those skilled in the art will recognize improvements and modifications to the preferred embodiments of the present invention. All such improvements and modifications are considered within the scope of the concepts disclosed herein and the claims that follow.

What is claimed is:

1. Wireless communication circuitry for facilitating polar modulation comprising:
   a) polar modulation logic adapted to provide an amplitude signal and a frequency signal corresponding to polar coordinates of symbols to be transmitted;
   b) power amplifier circuitry comprising a driver stage coupled in series with an output stage to amplify a function of the frequency signal and provide an amplified signal at an output of the output stage, the driver stage adapted to receive a first function of the amplitude signal as a supply voltage and the output stage adapted to selectively receive a second function of the amplitude signal as a supply voltage; and
   c) power control logic adapted to receive the amplitude signal and an output stage enable signal and selectively provide the second function of the amplitude signal to the output stage, wherein the output stage further amplifies the function of the frequency signal amplified by the driver stage when the second function of the amplitude signal is applied to the output stage, and capacitively couples the function of the frequency signal amplified by the driver stage to the output of the output stage when the second function of the amplitude signal is not applied.

2. The wireless communication circuitry of claim 1 further comprising bias logic adapted to provide bias current to the driver and output stages wherein the bias current is provided to the output stage regardless of whether the second function of the amplitude signal is applied to the output stage.

3. The wireless communication circuitry of claim 1 wherein the polar modulation circuitry comprises mapping logic for mapping data into rectangular coordinates corresponding to the symbols and polar conversion logic adapted to convert the rectangular coordinates into the amplitude and frequency signals.

4. The wireless communication circuitry of claim 3 wherein the polar modulation circuitry comprises first logic to generate a frequency with appropriate phase components in response to the frequency signal to create the function of the frequency signal.

5. The wireless communication circuitry of claim 4 wherein the polar modulation circuitry comprises digital-to-analog conversion logic adapted to convert the amplitude signal from digital to analog for processing by the power control logic.

6. The wireless communication circuitry of claim 3 wherein the mapping logic is adapted to facilitate mapping according to GSM.

7. The wireless communication circuitry of claim 3 wherein the mapping logic is adapted to facilitate mapping according to EDGE.

8. The wireless communication circuitry of claim 1 wherein the output stage comprises a transistor having an emitter coupled to ground, a base receiving the function of the frequency signal amplified by the driver stage, and a collector forming the output, such that when the second function of the amplitude signal is not applied to the output stage, the collector floats and the function of the frequency signal amplified by the driver stage is capacitively coupled internally between the base and the collector of the transistor.

9. The wireless communication circuitry of claim 1 wherein the output stage comprises a plurality of parallel transistor cells, each cell form including a transistor having an emitter coupled to ground, a base receiving the function of the frequency signal amplified by the driver stage, and a collector coupled to collectors of the transistors of the other cells to form the output, such that when the second function of the amplitude signal is not applied to the output stage, the collectors for each of the transistors float and the function of the frequency signal amplified by the driver stage is capacitively coupled internally between the bases and the collectors of the transistors.

10. The wireless communication circuitry of claim 9 wherein the transistors are heterojunction bipolar transistors.

11. The wireless communication circuitry of claim 1 wherein the output stage comprises a transistor having a source coupled to ground, a gate receiving the function of the frequency signal amplified by the driver stage, and a drain forming the output, such that when the second function of the amplitude signal is not applied to the output stage, the drain floats and the function of the frequency signal amplified by the driver stage is capacitively coupled internally between the gate and the drain of the transistor.

12. The wireless communication circuitry of claim 1 further comprising an initial driver stage prior to and in series with the driver stage to amplify the function of the frequency signal.

13. The wireless communication circuitry of claim 1 wherein a first power range is provided when the second function of the amplitude signal is applied to the output stage and a second power range is provided when the second function of the amplitude signal is not applied.

14. The wireless communication circuitry of claim 1 wherein the power control logic comprises a voltage regulator adapted to provide the second function of the amplitude signal and receive the amplitude signal and feedback of the second function of the amplitude signal and create a signal to drive the voltage regulator.

* * * * *

UNITED STATES PATENT AND TRADEMARK OFFICE
CERTIFICATE OF CORRECTION

PATENT NO. : 6,701,134 B1
DATED : March 2, 2004
INVENTOR(S) : Darrell Epperson It is certified that error appears in the above-identified patent and that said Letters Patent is hereby corrected as shown below:

Title page,
Item [56], References Cited, U.S. PATENT DOCUMENTS, "6,866,177" should read -- 6,366,177 B1 --

Signed and Sealed this

Twenty-first Day of December, 2004

JON W. DUDAS
*Director of the United States Patent and Trademark Office*